(12) United States Patent
Noh

(10) Patent No.: US 11,597,997 B2
(45) Date of Patent: Mar. 7, 2023

(54) APPARATUS, METHOD, AND RECORDING MEDIUM STORING COMMAND FOR CONTROLLING THIN-FILM DEPOSITION PROCESS

(71) Applicant: IVWorks Co., Ltd., Daejeon (KR)

(72) Inventor: Young Kyun Noh, Daejeon (KR)

(73) Assignee: IVWorks Co., Ltd., Daejeon (KR)

( * ) Notice: Subject to any disclaimer, the term of this patent is extended or adjusted under 35 U.S.C. 154(b) by 110 days.

(21) Appl. No.: 16/381,318

(22) Filed: Apr. 11, 2019

(65) Prior Publication Data

US 2020/0140993 A1 May 7, 2020

(30) Foreign Application Priority Data

Nov. 2, 2018 (KR) .......................... 10-2018-0133542

(51) Int. Cl.
  *C23C 14/54* (2006.01)
  *C23C 16/52* (2006.01)
  *G01N 23/20058* (2018.01)

(52) U.S. Cl.
  CPC .............. *C23C 14/54* (2013.01); *C23C 16/52* (2013.01); *G01N 23/20058* (2013.01)

(58) Field of Classification Search
  CPC ..................................................... C23C 16/52
  See application file for complete search history.

(56) References Cited

U.S. PATENT DOCUMENTS

| | | | |
|---|---|---|---|
| 6,593,748 B1 * | 7/2003 | Halliyal .................. | C23C 16/52 324/455 |
| 2001/0043668 A1 * | 11/2001 | Hayashi ................ | C23C 14/545 378/70 |
| 2002/0088400 A1 * | 7/2002 | Nakano ............. | H01J 37/32082 118/723 E |
| 2002/0142493 A1 | 10/2002 | Halliyal et al. | |

(Continued)

FOREIGN PATENT DOCUMENTS

| | | |
|---|---|---|
| EP | 1 123 562 A1 | 8/2001 |
| JP | H06-037021 A | 2/1994 |

(Continued)

OTHER PUBLICATIONS

Office Action issued in corresponding Taiwanese Patent Application No. 108109693 dated Mar. 2, 2020 with English translation.

(Continued)

*Primary Examiner* — Joseph A Miller, Jr.
(74) *Attorney, Agent, or Firm* — Foley & Lardner LLP

(57) ABSTRACT

The present disclosure discloses an apparatus. The apparatus according to the present disclosure may include a communication interface, one or more memories, and one or more processors. The one or more processors may be configured to: control the thin-film deposition devices to execute the thin-film deposition process by accessing the memory and executing a recipe; obtain in-process thin-film state data of the thin film from the thin-film measurement result received via the communication interface during the thin-film deposition process; and derive post-process thin-film state data of the thin film from the process condition data, the sensing data, and the in-process thin-film state data using a first correlation model.

18 Claims, 11 Drawing Sheets

(56) References Cited

U.S. PATENT DOCUMENTS

| | | | |
|---|---|---|---|
| 2003/0049376 A1 | 3/2003 | Schwarm et al. | |
| 2004/0026368 A1* | 2/2004 | Barnes ............... | G01N 21/9501 |
| | | | 216/60 |
| 2005/0095730 A1 | 5/2005 | Mikami | |
| 2009/0307163 A1 | 12/2009 | Jang et al. | |
| 2013/0189588 A1* | 7/2013 | Yada ..................... | C23C 14/088 |
| | | | 429/305 |
| 2016/0148850 A1 | 5/2016 | David | |
| 2018/0040460 A1 | 2/2018 | Gottscho | |

FOREIGN PATENT DOCUMENTS

| | | |
|---|---|---|
| JP | 3811150 B2 | 8/2006 |
| KR | 10-2009-0127681 A | 12/2009 |
| KR | 10-1340425 B1 | 12/2013 |
| KR | 10-2018-0067764 A1 | 6/2018 |
| WO | WO-2011/100506 A1 | 8/2011 |

OTHER PUBLICATIONS

Taiwanese Office Action issued in Application No. 109123463, dated Oct. 30, 2020.
European Search Report issued on European Application No. 19 16 2726 dated Oct. 18, 2019.
Office Action issued in corresponding Japanese Patent Application No. 2019-100773 dated Jul. 21, 2020 with English translation.
"IVWorks Co., Ltd." Presentation, Oct. 2018, 45 pages.

* cited by examiner

FIG. 9
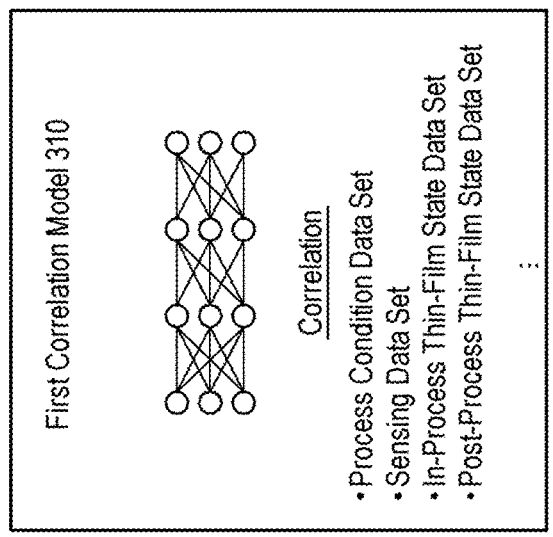
First Correlation Model 310
Correlation
- Process Condition Data Set
- Sensing Data Set
- In-Process Thin-Film State Data Set
- Post-Process Thin-Film State Data Set
Input
- Process Condition Data 320
- Sensing Data 325
- In-Process Thin-Film State Data 330
...
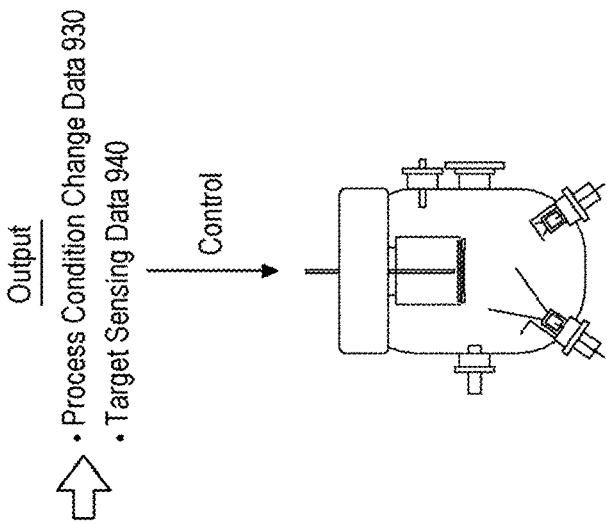
Output
- Process Condition Change Data 930
- Target Sensing Data 940
→ Control

APPARATUS, METHOD, AND RECORDING MEDIUM STORING COMMAND FOR CONTROLLING THIN-FILM DEPOSITION PROCESS

CROSS-REFERENCE TO RELATED APPLICATIONS

This application is based upon and claims the benefit of priority from Korean Patent Application No. 10-2018-0133542, filed on Nov. 2, 2018, the entire contents of which are incorporated herein by reference.

TECHNICAL FIELD

The present disclosure relates to a technique for controlling a thin-film deposition process.

BACKGROUND

A thin film may be deposited on a substrate (e.g., a wafer) accommodated in a process chamber through various thin-film deposition methods. With respect to a thin-film deposition process, data related to the deposition state of the thin film, the operating state of the thin-film deposition devices, and/or the process conditions of the thin-film deposition process may be collected. For example, data on the state of a thin film during a thin-film deposition process may be collected by, for example, electron diffraction measurement or X-ray diffraction spectroscopy. The collected data may be used for various analysis such as checking the state of the thin film and changing the process condition.

The collected data may be analyzed by a human user. The user may interpret the collected data and may change the process conditions or the like based on the interpreted result. However, it may be difficult for the user to perform analysis on the thin film or the process considering the collected data comprehensively. This is because, in the thin-film deposition process, various thin-film deposition methods may be used, and the kinds of data collected about the thin-film deposition processes are also becoming increasingly large. The interfaces of the thin-film deposition devices, the measurement devices for measuring the state of thin films, and the sensors for sensing the state of thin-film deposition devices may also be different, and thus it may not be easy for the user to know all the interfaces. In addition, the analysis results on collected data may vary depending on the user's ability and expertise. Specifically, when the collected data is not in a quantitative form, the deviation between the users of the analysis results becomes larger, and the reliability of the analysis results may be significantly lowered.

SUMMARY

The present disclosure provides a technique for controlling a thin-film deposition process using machine learning.

As an aspect of the present disclosure, an apparatus for controlling a thin-film deposition process is proposed. The apparatus according to an aspect of the present disclosure is an apparatus for controlling one or more thin-film deposition devices for depositing a thin film on a target substrate. The apparatus may include: a communication interface configured to communicate with the thin-film deposition devices, one or more sensors configured to generate sensing data by sensing a state of at least one of the thin-film deposition devices, and one or more measurement devices configured to generate a thin-film measurement result by measuring a state of the thin film on the target substrate; one or more memories configured to: store a recipe for performing a thin-film deposition process according to predetermined process condition data; and store a first correlation model that is established by modeling a correlation of a process condition data set, a sensing data set, an in-process thin-film state data set, and a post-process thin-film state data set according to a machine learning algorithm, wherein the process condition data set, the sensing data set, the in-process thin-film state data set, and the post-process thin-film state data set are generated for a plurality of substrates other than the target substrate; and one or more processors configured to: control the thin-film deposition devices to execute the thin-film deposition process by accessing the one or more memories and executing the recipe; obtain in-process thin-film state data of the thin film from the thin-film measurement result received via the communication interface during the thin-film deposition process; and derive post-process thin-film state data of the thin film from the process condition data, the sensing data, and the in-process thin-film state data using the first correlation model.

In an embodiment, the one or more memories are further configured to store specification data of the thin film, and wherein the one or more processors is further configured to calculate a probability that the thin film is to be determined to be good after the thin-film deposition process, based on the post-process thin-film state data and the specification data.

In an embodiment, the one or more processors are further configured to deliver a notification indicating the probability to one or more output devices when the probability is equal to or less than a predetermined reference value.

In an embodiment, the one or more processors are further configured to obtain pre-processed measurement data by converting a portion of the thin-film measurement result into quantitative data using a data conversion algorithm.

In an embodiment, the one or more memories are further configured to: store a second correlation model established by modeling a correlation of a thin-film measurement result set, a pre-processed measurement data set, and an in-process thin-film state data set, according to a machine learning algorithm, wherein the thin-film measurement result set, the pre-processed measurement data set, and the in-process thin-film state data set are generated for the plurality of substrates other than the target substrate, and wherein the one or more processors are further configured to: derive the in-process thin-film state data from at least one selected from the thin-film measurement result and the pre-processed measurement data using the second correlation model.

In an embodiment, the thin-film measurement result is a diffraction pattern image for a diffraction pattern that is formed when an electron beam, radiated to the thin film by the one or more measurement devices during the thin-film deposition process, is reflected from the thin film, wherein the pre-processed measurement data includes at least one selected from a pattern type of the diffraction pattern, a pattern interval of the diffraction pattern, and an intensity of the reflected electron beam, and wherein the in-process thin-film state data derived using the second correlation model includes at least one selected from a surface structure, a crystal structure, an atomic composition, stress, and deposition rate of the thin film during the thin-film deposition process.

In an embodiment, the one or more processors are further configured to deliver at least one selected from the process condition data, the sensing data, the in-process thin-film state data, the post-process thin-film state data, the thin-film measurement result, and the pre-processed measurement data to one or more output devices.

In an embodiment, the one or more processors are further configured to: derive at least one selected from process condition change data and target sensing data, that cause the post-process thin-film state data to be matched with the specification data, from the process condition data, the sensing data, and the in-process thin-film state data using the first correlation model; and control the thin-film deposition devices, based on at least one selected from the process condition change data and the target sensing data.

In an embodiment, the one or more processors are further configured to: derive at least one selected from process condition change data and target sensing data, which make the probability equal to or larger than the reference value, from the process condition data, the sensing data, and the in-process thin-film state data using the first correlation model; and control the thin-film deposition devices, based on at least one selected from the process condition change data and the target sensing data.

In an embodiment, the one or more processors are further configured to: receive the post-process thin-film state measurement data from a server, which stores post-process thin-film state measurement data that is measured on the thin film after the thin-film deposition process is performed, via the communication interface using a predetermined Application Program Interface (API).

In an embodiment, the one or more processors are further configured to: update the correlation of the first correlation model according to a machine learning algorithm by inputting the process condition data, the sensing data, the in-process thin-film state data, the post-process thin-film state measurement data, and the post-process thin-film state data derived from the first correlation model, to the first correlation model.

In an embodiment, the one or more thin-film deposition devices perform the thin-film deposition process according to at least one thin-film deposition method selected from Molecular Beam Epitaxy (MBE), Pulsed Laser Deposition (PLD), Metal Organic Chemical Vapor Deposition (MOCVD), Plasma Enhanced Chemical Vapor Deposition (PECVD), Atomic Layer Deposition (ALD), evaporation, sputtering, and sublimation.

As an aspect of the present disclosure, a thin-film deposition process is proposed. The thin-film deposition process according to an aspect of the present disclosure is a method for depositing a thin film on a target substrate using one or more thin-film deposition devices. The method may include: controlling, by one or more processors, the thin-film deposition devices to execute a thin-film deposition process by accessing one or more memories and executing a recipe for performing the thin-film deposition process according to predetermined process condition data; obtaining, by the one or more processors, a thin-film measurement result from one or more measurement devices that are configured to generate the thin-film measurement result by measuring a state of the thin film on the target substrate during the thin-film deposition process; obtaining, by the one or more processors, in-process thin-film state data of the thin film from the thin-film measurement result; and deriving, by the one or more processors, post-process thin-film state data of the thin film from the process condition data, sensing data, and the in-process thin-film state data using a first correlation model, wherein the sensing data is generated by sensing a state of at least one of the thin-film deposition devices by one or more sensors, wherein the first correlation model is established by modeling a correlation of a process condition data set, a sensing data set, an in-process thin-film state data set, and a post-process thin-film state data set according to a machine learning algorithm, and wherein the process condition data set, the sensing data set, the in-process thin-film state data set, and the post-process thin-film state data set are generated for a plurality of substrates other than the target substrate.

In an embodiment, the method further comprises: calculating, by the one or more processors, a probability that the thin film is to be determined to be good after the thin-film deposition process, based on the post-process thin-film state data and specification data of the thin film.

As an aspect of the present disclosure, a storage medium which stores commands for controlling a thin-film deposition process is proposed. The storage medium according to an aspect of the present disclosure may be a non-transitory computer-readable storage medium which stores commands that, when executed by one or more processors, cause the one or more processors to perform: controlling, by one or more processors, one or more thin-film deposition devices to execute a thin-film deposition process for depositing a thin film on a target substrate by executing a recipe for performing the thin-film deposition process according to predetermined process condition data; obtaining a thin-film measurement result from one or more measurement devices that are configured to generate the thin-film measurement result by measuring a state of the thin film on the target substrate during the thin-film deposition process; obtaining in-process thin-film state data of the thin film from the thin-film measurement result; and deriving post-process thin-film state data of the thin film from the process condition data, sensing data, and the in-process thin-film state data using a first correlation model, wherein the sensing data is generated by sensing a state of at least one of the thin-film deposition devices by one or more sensors, wherein the first correlation model is established by modeling a correlation of a process condition data set, a sensing data set, an in-process thin-film state data set, and a post-process thin-film state data set according to a machine learning algorithm, and wherein the process condition data set, the sensing data set, the in-process thin-film state data set, and the post-process thin-film state data set are generated for a plurality of substrates other than the target substrate.

In an embodiment, the commands further cause the one or more processors to perform: calculating a probability that the thin film is to be determined to be good after the thin-film deposition process, based on the post-process thin-film state data and specification data of the thin film; and delivering a notification indicating the probability to one or more output devices when the probability is equal to or less than a predetermined reference value.

In an embodiment, the obtaining the in-process thin-film state data includes: obtaining pre-processed measurement data by converting a portion of the thin-film measurement result into quantitative data using a data conversion algorithm.

In an embodiment, the obtaining the in-process thin-film state data further includes: deriving the in-process thin-film state data from at least one selected from the thin-film measurement result and the pre-processed measurement data using a second correlation model, wherein the second correlation model is established by modeling a correlation of a thin-film measurement result set, a pre-processed measurement data set, and an in-process thin-film state data set, according to a machine learning algorithm, and wherein the thin-film measurement result set, the pre-processed measurement data set, and the in-process thin-film state data set are generated for the plurality of substrates other than the target substrate.

In an embodiment, the thin-film measurement result is a diffraction pattern image for a diffraction pattern that is formed when an electron beam, radiated to the thin film by the one or more measurement devices during the thin-film deposition process, is reflected from the thin film, wherein the pre-processed measurement data includes at least one selected from a pattern type of the diffraction pattern, a pattern interval of the diffraction pattern, and an intensity of the reflected electron beam, and wherein the in-process thin-film state data derived using the second correlation model includes at least one selected from a surface structure, a crystal structure, an atomic composition, stress, and deposition rate of the thin film during the thin-film deposition process.

In an embodiment, the commands further cause the one or more processors to perform: delivering at least one selected from the process condition data, the sensing data, the in-process thin-film state data, the post-process thin-film state data, the thin-film measurement result, and the pre-processed measurement data to one or more output devices.

In an embodiment, the commands further cause the one or more processors to perform: deriving at least one selected from process condition change data and target sensing data, that make the probability equal to or larger than the reference value, from the process condition data, the sensing data, and the in-process thin-film state data using the first correlation model; and controlling the thin-film deposition device, based on at least one selected from the process condition change data and the target sensing data.

According to various embodiments of the present disclosure, the apparatus of the present disclosure is capable of performing an analysis in which various variables of a thin-film deposition process are comprehensively considered using correlation models established by machine learning.

According to various embodiments of the present disclosure, the apparatus of the present disclosure is capable of ensuring the reliability of analysis for a thin-film deposition process using correlation models established by machine learning.

BRIEF DESCRIPTION OF DRAWINGS

The above and other aspects, features and advantages of the present disclosure will be more apparent from the following detailed description taken in conjunction with the accompanying drawings, in which:

FIG. 9 is a diagram illustrating a process of controlling the thin-film deposition devices using the first correlation model according to an embodiment of the present disclosure.

DETAILED DESCRIPTION

Figure 1:
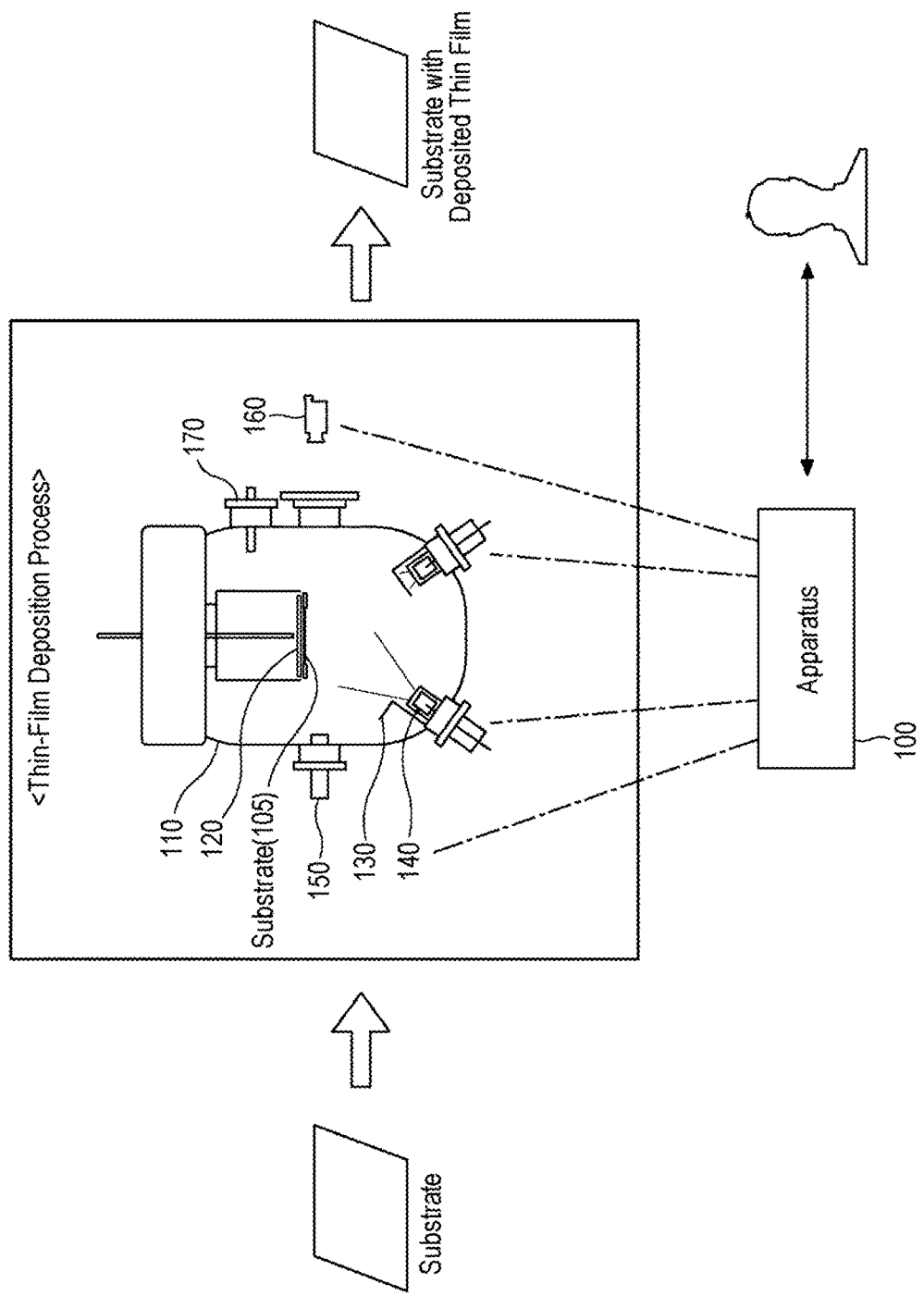
FIG. 1 is a diagram illustrating an embodiment of a process of operating an apparatus for controlling one or more thin-film deposition devices according to the present disclosure.

Various embodiments described herein are illustrated for the purpose of clarifying the technical idea of the present disclosure, and are not intended to limit the present disclosure to any specific embodiment. The technical idea of the present disclosure includes various modifications, equivalents, alternatives and embodiments selectively combined from all or part of individual embodiments described in the present document. Further, the scope of the technical idea of the present disclosure is not limited to the various embodiments described below, and the detailed description thereof.

In the present disclosure, terms including technical or scientific terms, may have meanings that are generally understood by those ordinarily skilled in the art to which this disclosure belongs, unless otherwise defined.

In the present disclosure, the expressions "A include B," "A may include B," "A is provided with B," "A may be provided with B," "A have B," "A may have B," and the like, mean that corresponding features (e.g., functions, operations, or components, etc.) are present, but do not exclude the presence of other additional features. That is, such expressions should be understood as open-ended terms that include the possibility of including other embodiments.

In the present disclosure, the singular of an expression may include the meaning of the plural of the expression unless otherwise indicated in the context clearly dictates otherwise, and the same applies to singular forms of expressions as set forth in the claims.

In the present disclosure, the expressions "1st," "2nd," "first," "second," and the like are used to distinguish one object from another in referring to plural same objects unless otherwise indicated in the context, and do not limit the order or importance of the objects.

In the present disclosure, the expressions "A, B and C," "A, B or C," "A, B and/or C," "at least one of A, B, and C," "at least one of A, B, or C," "at least one of A, B, and/or C," and so on may be used to refer to each listed item or any possible combination of the listed items may be provided. For example, the expression "at least one of A and B" may be used to refer to all of (1) A, (2) B, and (3) A and B.

In the present disclosure, the expression "based on . . . " is used to describe one or more factors that affect the action or operation of a decision or determination, described in a phrase or sentence in which the expression is contained, and does not exclude additional factors that influence the action or operation of the corresponding decisions or determination.

In the present disclosure, the expression that a component (e.g., a first component) is "connected" or "coupled" to another component (e.g., a second component) may mean that the first component is connected or coupled to the second component not only directly, but also via another new component (e.g., a third component).

In the present disclosure, the expression "configured to . . . " is intended to encompass, depending on the context, the meanings of "set to . . . ," "having performance of . . . ," "altered to . . . ," "made to . . . ," and "enabled to . . . ," and the like. The corresponding expression is not limited to the meaning "specifically designed in hardware." For example, a processor configured to perform a specific operation may mean a generic-purpose processor that can perform the specific operation by executing software.

Various embodiments of the present disclosure will now be described with reference to the accompanying drawings. In the accompanying drawings and the descriptions of the drawings, substantially equivalent elements may be given the same reference numerals. In the following description of the various embodiments, a description of the same or corresponding components may be omitted. However, this does not mean that the components are not included in the embodiment.

FIG. 1 is a diagram illustrating an embodiment of a process of operating an apparatus for controlling one or more thin-film deposition devices according to the present disclosure. The apparatus according to the present disclosure may be implemented by an apparatus 100 according to various embodiments. The apparatus 100 according to various embodiments of the present disclosure may derive data on post-processing thin-film state and the like from collected data using a correlation model established by machine learning. Through this, the apparatus 100 may perform analysis on the structural characteristics of a thin film, the electrical characteristics of a thin film, and optical characteristics of a thin film, data simulation, and the like.

Specifically, a thin-film deposition process may be performed using one or more thin-film deposition devices. The one or more thin-film deposition devices may deposit a thin film on a substrate 105 accommodated in a process chamber 110, according to predetermined process condition data. In the present disclosure, the substrate may be a plate or a container on which an element such as a semiconductor chip may be mounted, and the substrate may be used for manufacturing an integrated circuit or the like and may be formed of a material such as silicon. In the present disclosure, a thin film may mean a single crystal film grown on a substrate through various thin-film deposition methods. A substrate on which a thin film is deposited may be referred to as an epitaxial wafer. In this disclosure, the process chamber may be referred to as a thin-film deposition reactor or a thin-film deposition chamber.

In an embodiment, the one or more thin-film deposition devices may include a process chamber 110, a substrate heater 120, a shutter 130, a source heater 140, and so on. The substrate heater 120 may adjust the temperature of the substrate 105 in order to perform a thin-film deposition process. The shutter 130 may open/close a hole through which a source is emitted into the process chamber 110, thereby adjusting the emission of the source. In the present disclosure, the source may mean materials to be used as the materials of the thin film. The source heater 140 may heat the source so as to cause the source to be emitted into the process chamber 110. In an embodiment, the operation of each of the thin-film deposition devices may be controlled by the apparatus 100.

In the present disclosure, process condition data may mean information on the process conditions of a thin-film deposition process. Specifically, the process condition data may mean a sequence of physical and chemical steps that make up a thin-film deposition process, or variables associated with the thin-film deposition process or an environment in which the process is performed. In an embodiment, the process condition data may be included in a recipe of the thin-film deposition process. In an embodiment, the process condition data of the thin-film deposition process may include the kinds of the sources, the injection amounts of the sources, the injection order of the sources, and the like. In an embodiment, the process condition data may be adjusted as needed.

In an embodiment, one or more sensors may sense the state of at least one of the thin-film deposition devices. In the present disclosure, a sensor may be a device that generates or obtains sensing data corresponding to a specific state. The sensor may generate data corresponding to an operating or environmental condition of an object. In the present disclosure, the term sensing may include the meaning of detection. In an embodiment, the one or more sensors may include a temperature sensor that measures the temperature of a substrate 105 heated by the substrate heater 120, a flow rate sensor and/or a pressure sensor that measure the amount of a source emitted through the opening/closing operation of the shutter 130, a speed sensor that measures the speed of opening/closing a source emission port by the shutter 130, a temperature sensor that measures the temperature of the source heated by the source heater 140, a temperature sensor that measures the temperature of the process chamber 110, a pressure sensor that measures the pressure of the process chamber 110, a residual gas measurement sensor 170 that measures the residual gas remaining in the process chamber 110, and/or a position sensor that measures the position of the substrate 105 in the process chamber 110. The residual gas measured by the residual gas measurement sensor 170 may be used to confirm the environment in the process chamber 110 through molecular mass analysis. In an embodiment, the sensing data may change in real time as the thin-film deposition process proceeds.

Meanwhile, the one or more measurement devices may measure the states of a thin film during the thin-film deposition process in various ways (e.g., in-situ measurement). Depending on the measurements, the one or more measurement devices may obtain various thin-film measurement results. From the obtained thin-film measurement result, data such as the crystal structure of the thin film, the surface structure of the thin film, the atomic composition of the thin film, the deposition rate of the thin film, and the stress of the thin film may be derived.

The one or more measurement devices may perform measurements according to, for example, an electronic irradiation or light irradiation method. In an embodiment, the electron irradiation method may include, for example, a reflection high-energy electron diffraction measurement method, a measurement method using a reflection electron microscope, a low-energy electron diffraction measurement method, or a measurement method using a scanning electron microscopy. In an embodiment, the light irradiation method may include, for example, a measurement method using a reflectometer, a measurement method using an infrared ray temperature sensor (pyrometer), an X-ray diffraction spectroscopy measurement method, a measurement method using an optical interferometer, a laser profile measurement method, a measurement method using absorption, transmission, or reflection of light, or an optical emission spectroscopy measurement method.

For example, the one or more measurement devices may measure the state of a thin film through a reflection high-energy electron diffraction measurement. Among the one or more measurement devices, an electron gun 150 may irradiate a thin film in the process with an electron beam. The electron beam is reflected from the surface of the thin film deposited on the substrate 105, and the reflected electron beam may form a diffraction pattern depending on the crystal structure of the thin film. The diffraction pattern may be measured in the form of a diffraction pattern image 160. The formed diffraction pattern has a resolution of 1.0 nm or less, so that it can be used to monitor the crystal structure of the thin film during the thin-film deposition process at an atomic layer level. The diffraction pattern image may contain information on the crystal structure of the thin film.

The apparatus 100 may communicate with one or more thin-film deposition devices, one or more sensors, and/or one or more measurement devices. The apparatus 100 may obtain sensing data from the one or more sensors. The sensing data may be generated by sensing the state of at least one of the one or more thin-film deposition devices by the one or more sensors. The apparatus 100 may obtain the thin-film measurement results on the state of the thin film in the thin-film deposition process from the one or more measurement devices.

The apparatus 100 may execute a recipe so as to control the one or more thin-film deposition devices to perform a thin-film deposition process. In an embodiment, the apparatus 100 may obtain "in-process thin-film state data," which shows the state of a thin film in a thin-film deposition process, based on the obtained thin-film measurement result. The thin-film state in the present disclosure may mean, for example, the surface structure of the thin film, the crystal structure of the thin film, the atomic composition of the thin film, and the stress of the thin film.

The apparatus 100 may derive, using a first correlation model, "post-process thin-film state data," which shows the state of a thin film after a thin-film deposition process, from the obtained data. Specifically, the apparatus 100 may input the process condition data, the sensing data, and/or the derived in-process thin-film state data to the first correlation model. The first correlation model may output or calculate the post-process thin-film state data of the thin film in response to the input. That is, the apparatus 100 may derive the post-process thin-film state data of the thin film from the first correlation model. In an embodiment, the apparatus 100 may display various pieces of information to the user, such as derived post-process thin-film state data, process condition data, and a thin-film measurement result.

The first correlation model according to the present disclosure may be established based on various databases associated with thin-film deposition processes. According to multiple embodiments, the first correlation model may be a correlation model established by modeling a correlation of a process condition data set, a sensing data set, an in-process thin-film state data set, and/or a post-process thin-film state data set according to a machine learning algorithm. Here, a data set may mean a set of corresponding data. For example, the process condition data set may mean a plurality of process condition data. In an embodiment, the process condition data set, the sensing data set, the in-process thin-film state data set, and/or the post-process thin-film state data set may be data generated in advance for a plurality of substrates other than the in-process substrate 105 which is currently in the thin film deposition process. The first correlation model may derive post-process thin-film state data of the target thin film based on input process condition data, sensing data, in-process thin-film state data, and/or other information and output the derived post-process thin-film state data. Further details of the machine learning and correlation model will be described later.

In an embodiment, the one or more thin-film deposition devices may perform a thin-film deposition process according to at least one of thin-film deposition method selected among Molecular Beam Epitaxy (MBE), Pulsed Laser Deposition (PLD), Metal Organic Chemical Vapor Deposition (MOCVD), Plasma Enhanced Chemical Vapor Deposition (PECVD), Atomic Layer Deposition (ALD), evaporation, sputtering, and sublimation.

In an embodiment, thin-film deposition processes may be performed simultaneously on a plurality of process lines. In each of the plurality of process lines, a thin-film deposition process may be performed by one or more thin-film deposition devices. Each of the plurality of process lines may be distinguished from the other process lines according to an identification number. Even if the same kinds of thin-film deposition devices and the same process condition data are used for the plurality of process lines, respectively, the thin-film deposition processes may be performed differently in the respective process lines. Thus, a separate first correlation model and a separate second correlation model may be established for each of the plurality of process lines. The second correlation model will be described later.

Figure 2:
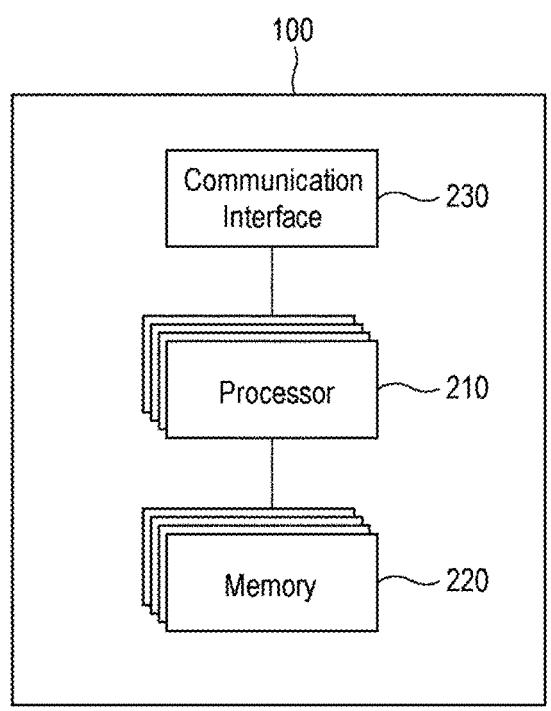
FIG. 2 is a block diagram of an apparatus for controlling one or more thin-film deposition devices according to various embodiments of the present disclosure.

FIG. 2 is a block diagram of an apparatus for controlling one or more thin-film deposition devices according to various embodiments of the present disclosure. In an embodiment, the apparatus 100 may include one or more processors 210, one or more memories 220 and/or a communication interface 230. In an embodiment, at least one of these components of the apparatus 100 may be omitted, or another component may be added to the apparatus 100. Additionally or alternatively, some of the components may be integrated or implemented as a single entity or multiple entities. At least some of the components of the apparatus 100 are connected to each other via a bus, a General-Purpose Input/Output (GPIO), a Serial Peripheral Interface (SPI), or a Mobile Industry Processor Interface (MIPI) so as to exchange data and/or signals.

The communication interface 230 may perform wireless or wired communication between the apparatus 100 and the server, or between the apparatus 100 and another external apparatus. For example, the communication interface may perform wireless communication depending on a system, such as enhanced Mobile Broadband (eMBB), Ultra Reliable Low-Latency Communication (URLLC), Massive Machine-Type Communication (MMTC), Long-Term Evolution (LTE), LTE-A (LTE Advanced), Universal Mobile Telecommunications System (UMTS), Global System for Mobile communication (GSM), Code Division Multiple Access (CDMA), Wideband CDMA (WCDMA), Wireless Broadband (WiBro), Wi-Fi communication, Bluetooth, Near Field Communication (NFC), Global Positioning System (GPS), or Global Navigation Satellite System (GNSS). For example, the communication interface may perform wired communication according to a system, such as Universal Serial Bus (USB), High Definition Multimedia Interface (HDMI), Recommended Standard 232 (RS-232), or Plain Old Telephone Service (POTS). In an embodiment, the communication interface 230 may communicate with the one or more thin-film deposition devices, the one or more sensors, and/or the one or more measurement devices.

The one or more memories 220 may store various data. The data stored in the memory 220 are acquired, processed, or used by at least one component of the apparatus 100, and may include software (e.g., commands, programs, etc.). The memory 220 may include a volatile memory and/or a nonvolatile memory. In this disclosure, the commands and programs are software stored in the memory 220 and may include an operating system for controlling resources of the apparatus 100, an application, and/or a middleware that provides various functions to the application, so that the application can utilize the resources of the apparatus. The one or more memories 220 may store the first correlation model described above and other correlation models to be described below. In addition, the one or more memories 220 may store a recipe for performing a thin-film deposition process according to predetermined process condition data. In addition, the one or more memories 220 may also store commands that, when executed by the one or more processors 210, cause the one or more processors 210 to perform operations.

The one or more processors 210 may drive software (e.g., commands, programs, etc.) so as to control at least one component of the apparatus 100 connected to the one or more processors 210. The processor 210 may also perform various operations, processes, data generation, processing, and the like, which are related to the present disclosure. The processor 210 may also load data or the like from the memory 220 or store the data in the memory 220.

The one or more processors 210 may access the memory 220 to execute the recipe described above and thereby cause the one or more thin-film deposition devices to perform a thin-film deposition process. In addition, the one or more processors 210 may control the communication interface 230 to obtain, from the one or more sensors, sensing data obtained by sensing the state of at least one of the thin-film deposition devices. In addition, the one or more processors 210 may control the communication interface 230 to receive thin-film measurement results for thin films during the thin-film deposition process from the one or more measurement devices. The one or more processors 210 may obtain thin-film state information on the thin films in the thin-film deposition process based on the received thin-film measurement results. The one or more processors 210 may derive the post-process thin-film state data of the target thin film from the obtained process condition data, sensing data and/or in-process thin-film state data of the target thin film, using the first correlation model.

In an embodiment, the one or more processors 210 may receive commands input by a user from one or more input devices. The input device may be a device that receives data input from the outside so as to transfer the data to at least one component of the apparatus 100. The input device may include, for example, a mouse, a keyboard, and a touch pad. In an embodiment, the information that the one or more processors 210 receive from the input devices may include new process conditions entered by an user, the post-process thin-film state measurement data measured for a substrate after the thin film deposition process, signals for controlling the one or more thin-film deposition devices, sensors, measurement devices, and so on.

In addition, in an embodiment, the one or more processors 210 may deliver various pieces of information to one or more output devices. The output device may visually provide various information received from the apparatus 100 to the user. The output device may include, for example, a display, a projector, a hologram, and the like. In an embodiment, the information delivered to the output devices by the one or more processors 210 may include derived in-process thin-film state data, process condition data, thin-film measurement results, and so on.

In one embodiment, the apparatus 100 may be implemented as various types of devices. The apparatus 100 may be implemented as, for example, a portable communication device, a computer device, a portable multimedia device, a wearable device, or a device according to one or more combinations of the above-described devices. The apparatus 100 of the present disclosure is not limited to the above-described devices.

Various embodiments of the apparatus 100 according to the present disclosure may be combined with one another. Respective embodiments may be combined according to the number of cases, and the combined embodiments of the apparatus 100 also belong to the scope of the present disclosure. In addition, the internal/external components of the apparatus 100 according to the above-described present disclosure may be added, changed, substituted, or deleted in accordance with embodiments. In addition, the internal/external components of the above-described apparatus 100 may be implemented using hardware components.

Figure 3:
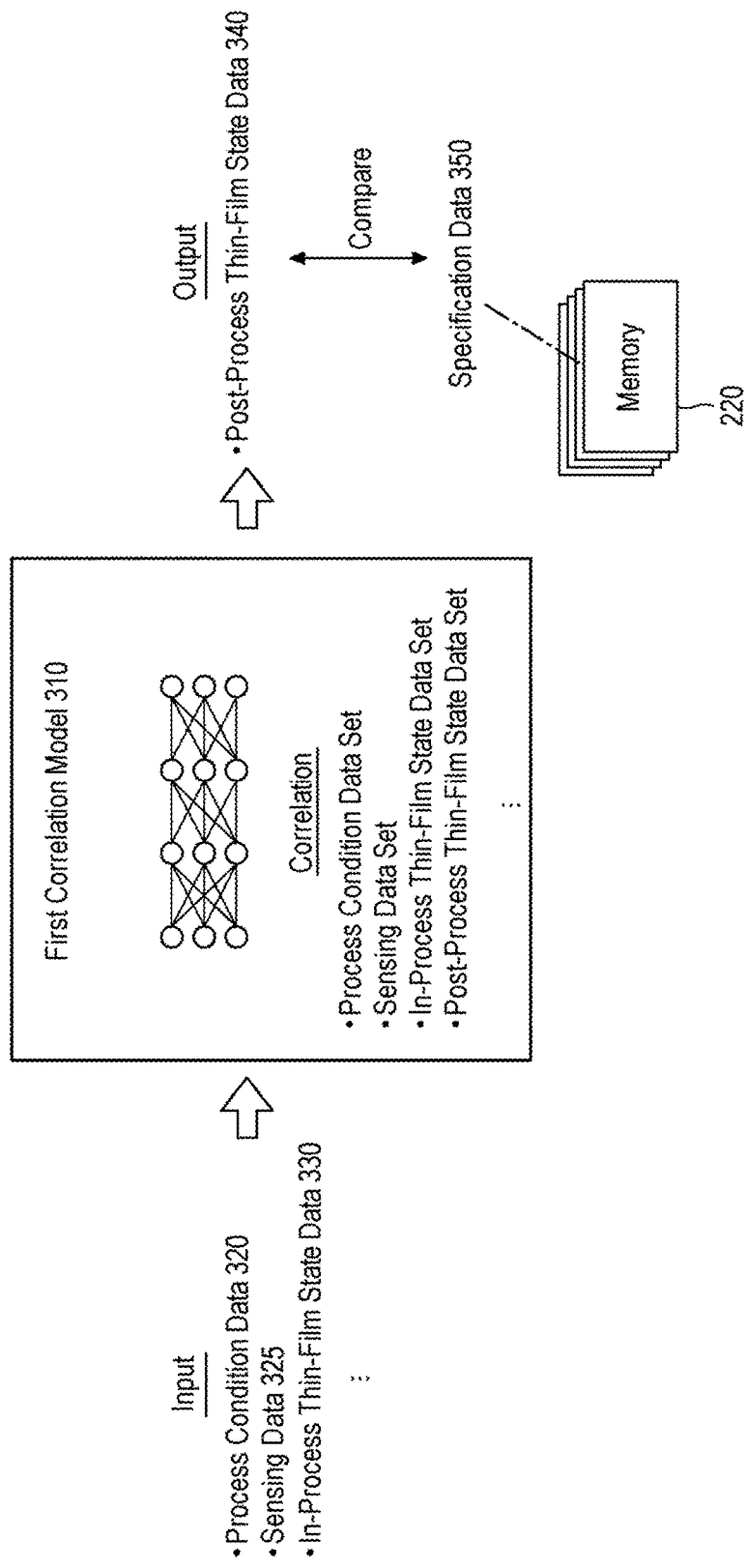
FIG. 3 is a diagram illustrating a first correlation model according to an embodiment of the present disclosure.

FIG. 3 is a diagram illustrating a first correlation model according to an embodiment of the present disclosure. As described above, the first correlation model 310 may be a correlation model established by modeling a correlation of a process condition data set, a sensing data set, an in-process thin-film state data set, and/or a post-process thin-film state data set according to a machine learning algorithm. The post-process thin-film state data of a thin film may be thin-film state data derived (predicted) based on the first correlation model 310. In an embodiment, the first correlation model 310 may be established further considering correlation with other data, such as post-process thin-film state measurement data measured for a post-process substrate, in addition to the above-described data.

In the present disclosure, machine learning may mean that computer software enhances a data processing capability through learning using data and data processing experience. Machine learning may be performed by a correlation model. The correlation model is established by modeling the correlation between data, and the correlation may be expressed by a plurality of parameters. The correlation model extracts features from given data and and analyzes the features so as to derive a correlation between the data. The process of repeating this process and optimizing the parameters of the correlation model may be referred to as mechanical learning. For example, when data is given as pairs of input and output of a correlation model, the correlation model may learn mapping (a correlation) between the input and output. Even if only input data is given, the correlation model may derive the regularity between the given data and learn the relationship among the input data. In an embodiment, a machine learning algorithm may be at least one selected from a decision tree learning method, an association rule learning method, an artificial neural network, a genetic programming method, an inductive logic programming method, a support vector machine, clustering, a Bayesian network, a reinforcement learning method, an expression learning method, and/or an equality metric learning method.

The one or more processors 210 may input process condition data 320, sensing data 325 and/or in-process thin-film state data 330, which are described above, to the first correlation model 310. The first correlation model 310 may derive (predict) post-process thin-film state data 340 of the target thin film based on the input process condition data 320, the sensing data 325, the in-process thin-film state data 330, and/or other data. The first correlation model 310 may output the post-process thin-film state data 340.

In an embodiment, the one or more processors 210 may calculate (derive) a probability 360 that the target thin film in the current process is to be determined to be good after the process, based on the derived post-process thin-film state data 340 and specification data 350 indicating the specification of the target thin film. The one or more processors 210 may compare the derived post-process thin-film state data 340 to the thin film specification data 350. The thin film specification data may be stored in the one or more memories 220.

In an embodiment, when the calculated probability 360 is equal to or less than a predetermined reference value, the one or more processors 210 may deliver a notification indicating the calculated probability 360 to the one or more output devices. The predetermined reference value may be stored in the one or more memories 220. The reference value may be set differently depending on an embodiment. The one or more output devices may display the notification indicating the probability 360 to the user. In an embodiment, the shown notification may further include, in addition to the calculated probability 360, the reference value, the specification data 350, the process condition data 320, the in-process thin-film state data 330, and/or the post-process thin-film state data 340 that is derived by the first correlation model 310.

Figure 4:
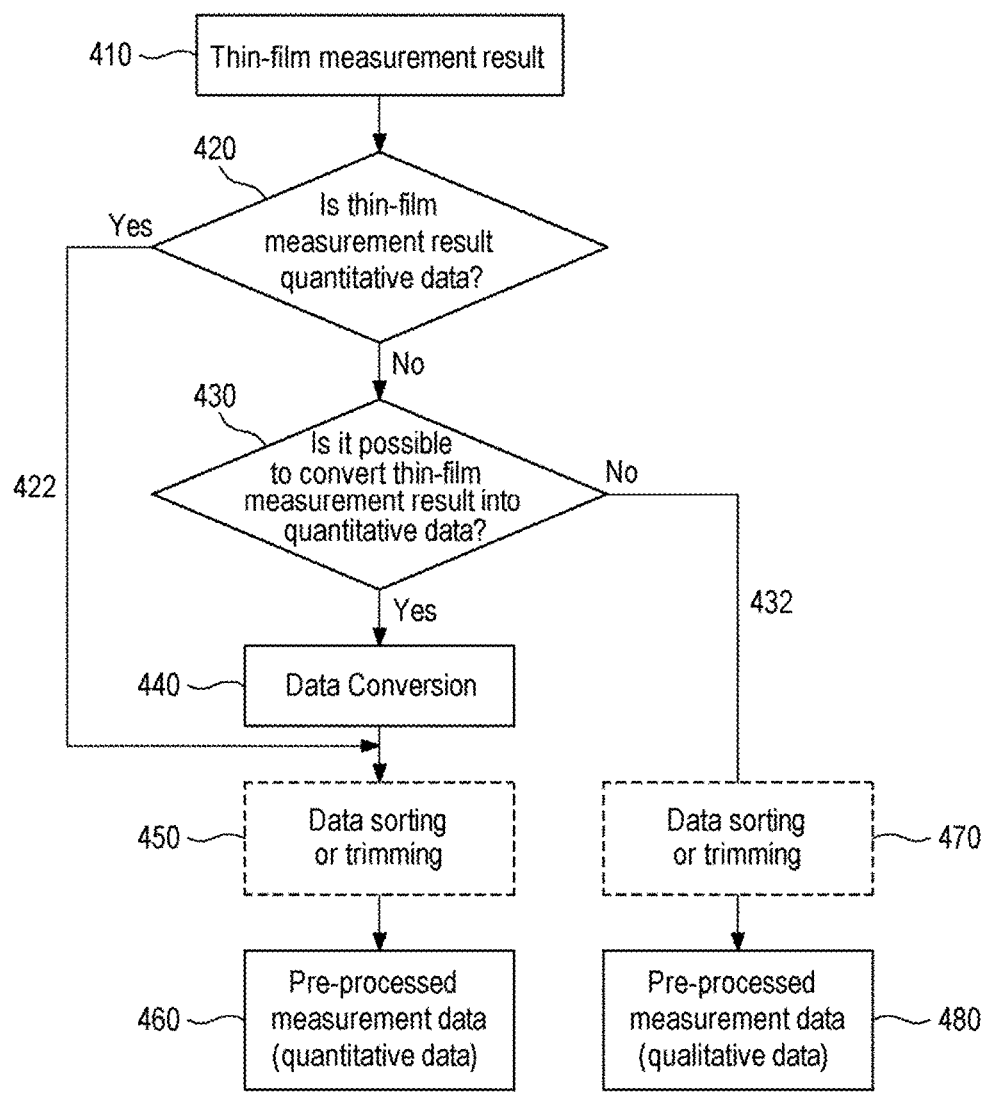
FIG. 4 is a diagram illustrating a process of pre-processing thin-film measurement results according to an embodiment of the present disclosure.

FIG. 4 is a diagram illustrating a process of pre-processing thin-film measurement results according to an embodiment of the present disclosure. As described above, the one or more processors 210 may obtain (derive) the thin-film state data of the thin film in the thin-film deposition process, based on thin-film measurement results 410 received from the one or more measurement devices. In an embodiment, the process of obtaining the in-process thin-film state data from the thin-film measurement results 410 may be performed using a second correlation model established by machine learning. The second correlation model will be described later. Prior to using the second correlation model, the one or more processors 210 may pre-process the thin-film measurement results 410. In the pre-processing process, the one or more processors 210 may convert a portion of the thin-film measurement results 410 into quantitative data according to a data conversion algorithm so as to obtain pre-processed measurement data 460 and 480.

Specifically, the one or more processors 210 may determine whether or not the obtained thin-film measurement results 410 are quantitative data (420). In the present disclosure, the data may be either quantitative or qualitative data. Quantitative data is numerically expressible data, which is formatted data and which may be statistically analyzable data. Qualitative data is categorical data that is represented by description in natural language, which is unstructured data, and on which statistical analysis may not be easy. When the thin-film measurement results 410 are quantitative data, the one or more processors 210 may not perform a data conversion process on the corresponding data (422).

When the thin-film measurement results 410 are qualitative data, the one or more processors 210 may determine whether or not the thin-film measurement results 410 are convertible into quantitative data (430). When the thin-film measurement results 410 are not convertible into quantitative data, the one or more processors 210 may not perform a separate data conversion process on the corresponding data (432).

When the thin-film measurement results 410 are convertible into qualitative data, the one or more processors 210 may convert the corresponding thin-film measurement results 410 into quantitative data (440). In an embodiment, the data conversion may be performed by a general data processing algorithm. In an embodiment, the data conversion process (440) may also be performed by a separate correlation model established by machine learning.

In an embodiment, the thin-film measurement results which are originally quantitative data (422), and the thin-film measurement results that are quantified through the data conversion (440), may be sorted or trimmed by the one or more processors 210 (450). The data that is sorted or trimmed may be used as pre-processed measurement data 460. The pre-processed measurement data 460 may be quantitative data.

In an embodiment, the thin-film measurement results which are not convertible to quantitative data (432), may also be sorted or trimmed by the one or more processors 210 (470). The data that is sorted or trimmed may be used as pre-processed measurement data 480. The pre-processed measurement data 480 may be qualitative data.

In an embodiment, a general sorting algorithm or trimming algorithm may be used for the data-sorting and/or trimming process (450 and 470). In an embodiment, the data-sorting and/or trimming process (450 and 470) may be omitted.

Figure 5:
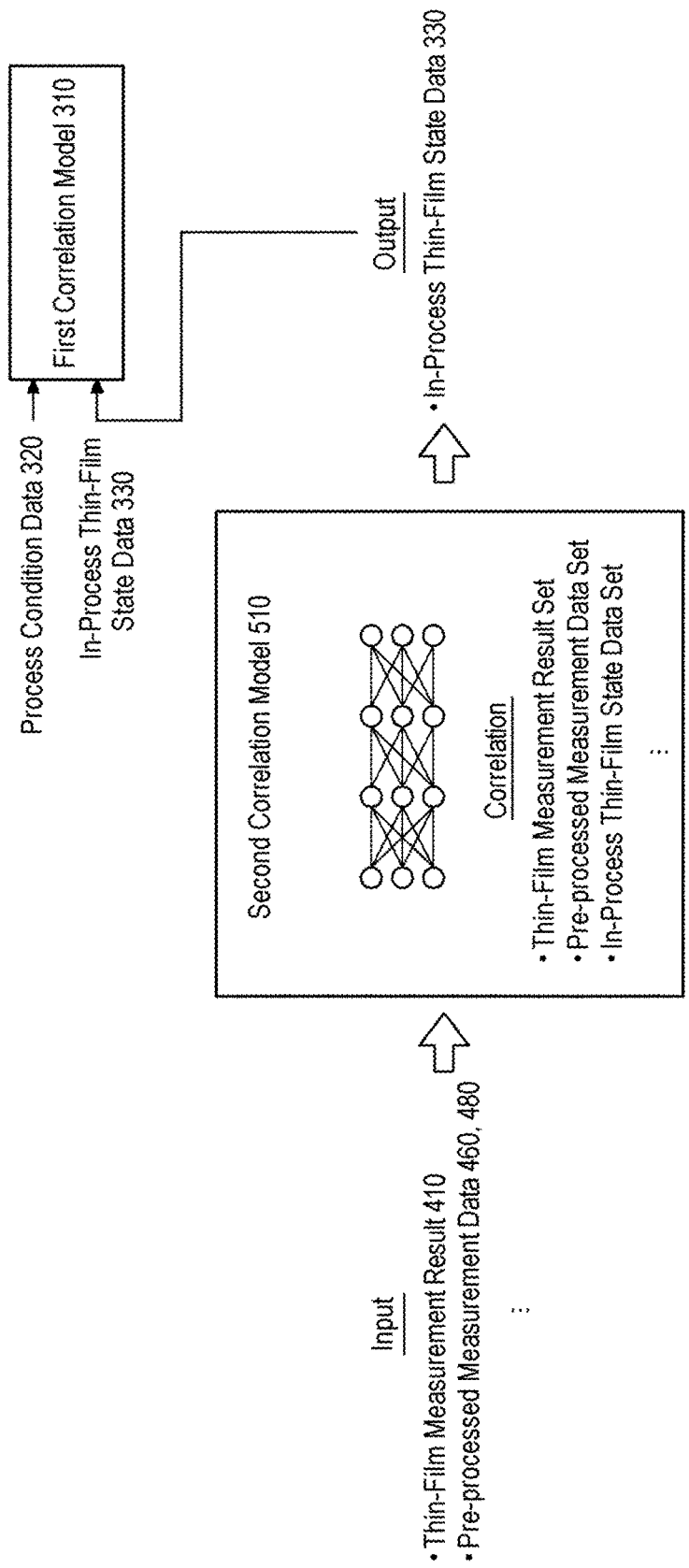
FIG. 5 is a diagram illustrating a second correlation model according to an embodiment of the present disclosure.

FIG. 5 is a diagram illustrating a second correlation model according to an embodiment of the present disclosure. In an embodiment, the apparatus 100 may derive in-process thin-film state data 330 from the thin-film measurement results 410 and/or the pre-processed measurement data 460 and 480. For this purpose, a second correlation model 510 established by machine learning may be used.

Specifically, the one or more memories 220 may further store the second correlation model 510. The second correlation model 510 may be a correlation model established by modeling the correlation of a thin-film measurement result set, a pre-processed measurement data set, and/or an in-process thin-film state data set, according to a machine learning algorithm. In an embodiment, the thin-film measurement result set, the pre-processed measurement data set, and/or the post-process thin-film state data set may be generated in advance for a plurality of substrates other than the in-process substrate 105 that is currently in the thin film deposition process.

The one or more processors 210 may derive in-process thin-film state data 330 of the target thin film from the thin-film measurement results 410, the pre-processed measurement data 460 and 480 and/or other information, using the second correlation model 510. Specifically, the one or more processors 210 may input the thin-film measurement results 410 and/or the pre-processed measurement data 460 and 480 to the second correlation model 510. The one or more processors 210 may derive in-process thin-film state data of the target thin film from the second correlation model 510. In an embodiment, the in-process thin-film state data 330 derived by the second correlation model 510, may be input to the first correlation model 310, as described above.

In the present embodiment, the first correlation model 310 and the second correlation model 510 are exemplified as being established as two separate models, but the present disclosure is not limited thereto. In an embodiment, some or all of the first correlation model 310 and the second correlation model 510 may be integrally established. As another example, the first correlation model 310 and the second correlation model 510 may be established with three or more sub-models.

Figure 6:
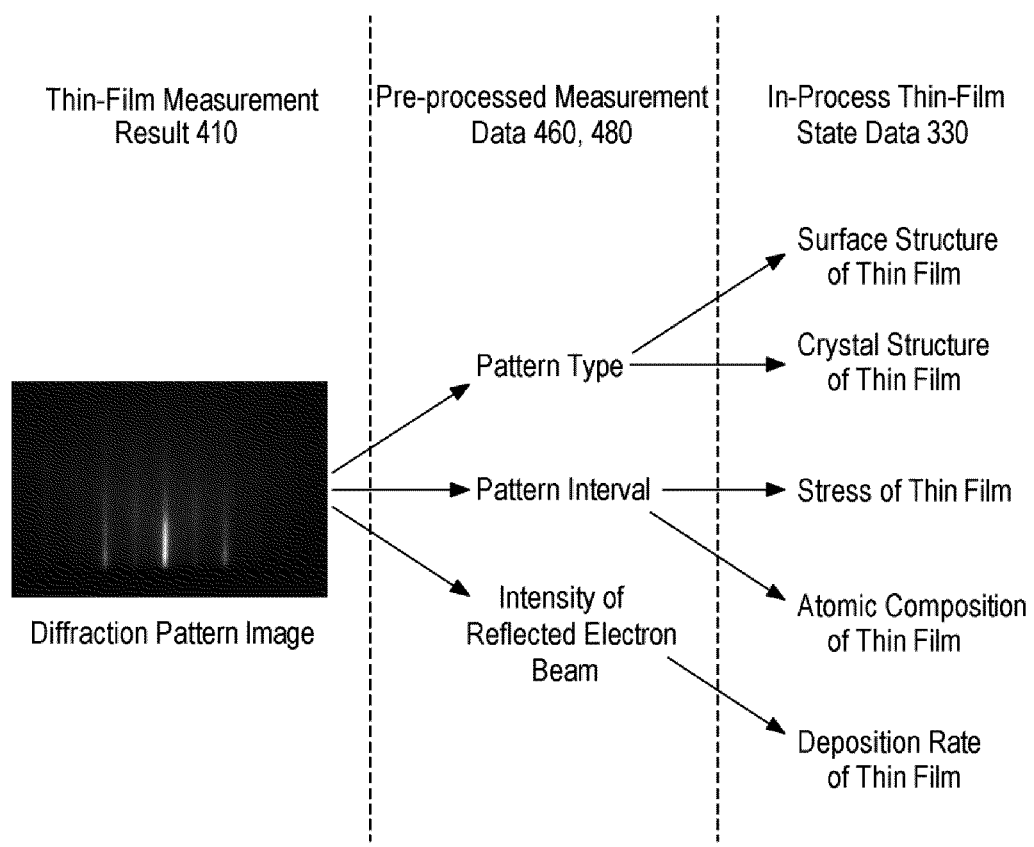
FIG. 6 is a diagram illustrating a process of deriving in-process thin-film state data from a diffraction pattern image according to an embodiment of the present disclosure.

FIG. 6 is a diagram illustrating a process of deriving in-process thin-film state data from a diffraction pattern image according to an embodiment of the present disclosure. In an embodiment, the thin-film measurement result 410 may be a diffraction pattern image obtained from the one or more measurement devices through a reflection high-energy electron diffraction measurement.

In an embodiment, based on a diffraction pattern image, which is a thin-film measurement result 410, the one or more processors 210 may derive the pattern type and pattern interval of the diffraction pattern, and/or the intensity of a reflected electron beam, which are pre-processed measurement data 460 and 480. The process of deriving the pre-processed measurement data 460 and 480 from the thin-film measurement results 410 is as described above. In an embodiment, the diffraction pattern type may be qualitative data, and the pattern interval and/or the intensity of the reflected electron beam may be quantitative data.

In an embodiment, the one or more processors 210 may derive (predict) in-process thin-film state data 330 from a diffraction pattern image, which is a thin-film measurement result 410, and/or the pattern type and pattern interval of the diffraction pattern and the intensity of the reflected electron beam, which are the pre-processed measurement data 460 and 480. The derived in-process thin-film state data 330 may include, for example, the surface structure of the thin film, the crystal structure of the thin film, the atomic composition of the thin film, and the stress of the thin film, and/or the deposition rate of the thin film. The process of in-process thin-film state data 330 may be performed using the second correlation model 510, as described above. For example, the one or more processors 210 may derive the surface structure of the thin film and/or the crystal structure of the thin film from the diffraction pattern type. The one or more processors 210 may derive the atomic composition of the film and/or the stress of the film from the pattern interval. In addition, the one or more processors 210 may derive the deposition rate of the thin film from the intensity of the reflected electron beam.

Figure 7:
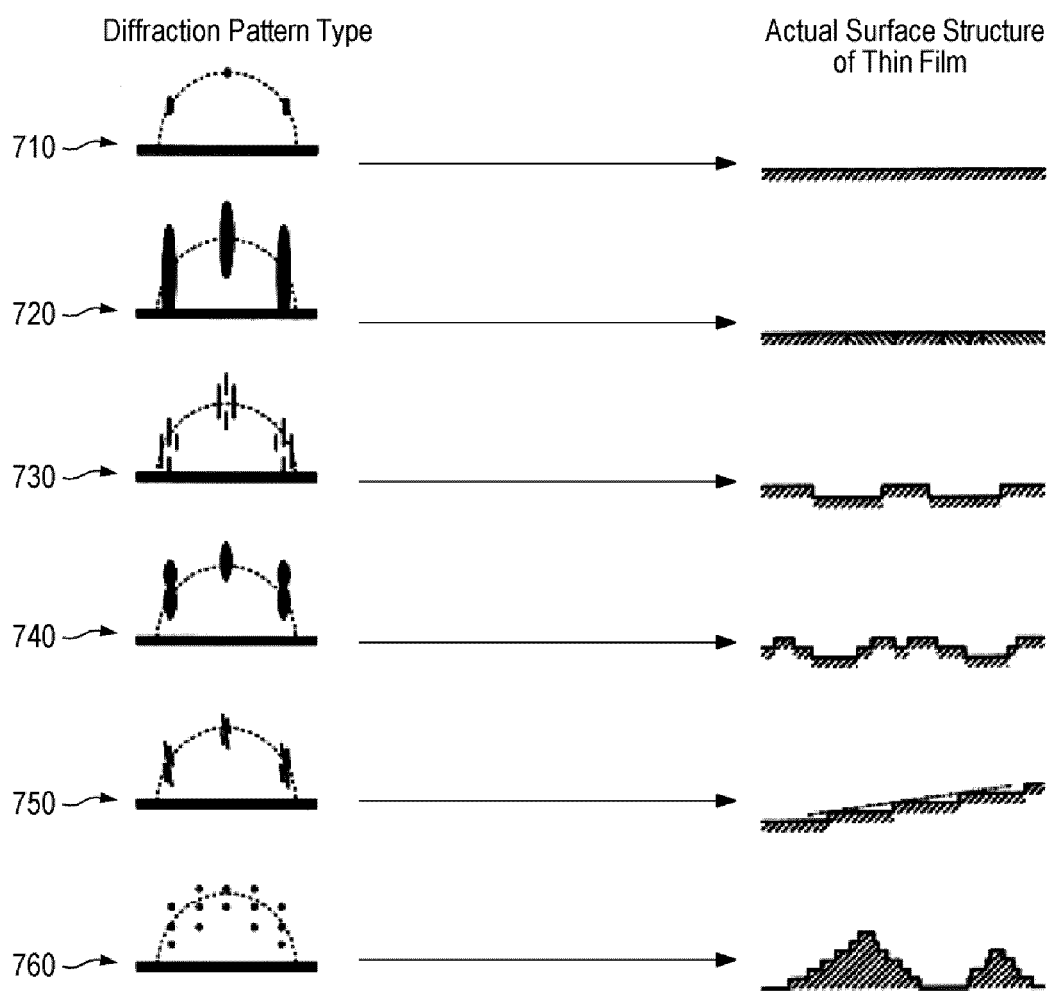
FIG. 7 is a diagram illustrating the actual surface structures of thin films having respective diffraction pattern types according to an embodiment of the present disclosure.

FIG. 7 is a diagram illustrating the actual surface structures of thin films having respective diffraction pattern types according to an embodiment of the present disclosure. As described above, the actual surface structure of a thin film may be derived from a diffraction pattern type. Prediction of the actual surface structure of a thin film according to a diffraction pattern type may be performed by the second correlation model 510. The second correlation model 510 may mechanically learn the correlation between the diffraction pattern type and the surface structure of a thin film so as to derive the expected surface structure of the thin film from the diffraction pattern type.

For example, when the diffraction pattern is of a type of spots, the surface structure of the thin film may be predicted to have a flat and single crystalline surface 710. When the diffraction pattern is of a type of streaks, the surface structure of the thin film may be predicted to be in the form of a flat surface with small regions 720. When the diffraction pattern is a type having satellite streaks, the surface structure of the thin film may be predicted to be a two-level stepped surface 730. When the diffraction pattern is a type having modulated streaks, the surface structure of the thin film may be predicted to be a multilevel stepped surface 740. When the diffraction pattern is a type having inclined streaks, the surface structure of the thin film may be predicted to be in the form of a vicinal surface 750. When the diffraction pattern is a type having transmission spots, the surface structure of the thin film may be predicted to be in the form of 3D islands 760.

Figure 8:
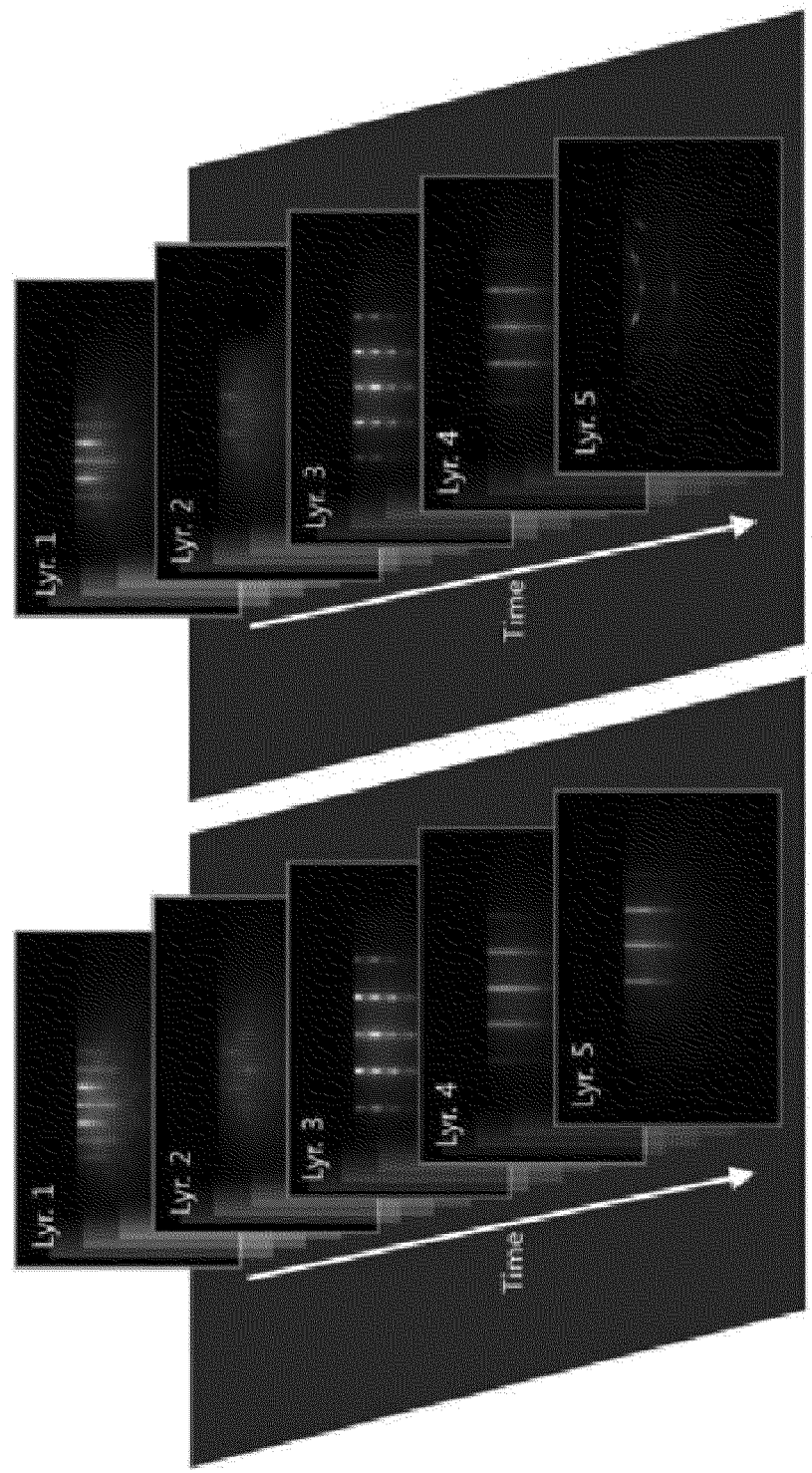
FIG. 8 is a diagram illustrating diffraction pattern images obtained in real time during a thin-film deposition process according to an embodiment of the present disclosure.

FIG. 8 is a diagram illustrating diffraction pattern images obtained in real time during a thin-film deposition process according to an embodiment of the present disclosure. In an embodiment, a plurality of diffraction pattern images may be successively obtained for a thin film in a thin-film deposition process. Each of the diffraction pattern images may have information on the surface of the thin film at the corresponding time. The state of the thin film in the thin-film deposition process may be determined in real time by analyzing the successively obtained diffraction pattern images using the second correlation model 510 according to the above-described process.

FIG. 9 is a diagram illustrating a process of controlling the thin-film deposition devices using the first correlation model according to an embodiment of the present disclosure. In one embodiment, the apparatus 100 may derive process condition change data 930 and/or target sensing data 940 that causes a thin film after a thin-film deposition process to have a desired thin-film state using the first correlation model 310 described above. In the present disclosure, the process condition change data 930 may be process condition data obtained by changing the process condition data used in the current process in order to make post-process thin-film state data have a desired value. In this disclosure, the target sensing data 940 may mean a target values for sensing data that is obtained by sensing the states (e.g., the operating state) of one or more thin-film deposition devices in order to make post-process thin-film state data 340 have a desired value. That is, when the one or more thin-film deposition devices operate in accordance with the derived process condition change data 930 and/or the target sensing data 940, the first correlation model 310 may determine that desired post-process thin-film state data 340 can be achieved.

Specifically, the one or more processors 210 may input the process condition data 320, the sensing data 325, and/or the derived in-process thin-film state data 330 to the first correlation model 310. The first correlation model may output the above-described process condition change data 930 and/or the target sensing data 940 in response to the input.

In an embodiment, the process condition change data 930 and/or the target sensing data 940 may be process condition data and/or sensing data that cause the post-process thin-film state data 340 to match the above-described specification data 350.

In an embodiment, the process condition change data 930 and/or the target sensing data 940 may be process condition data and/or sensing data for making the probability 360 that the target thin film in the current process is to be determined to be good after the current process to be equal to or larger than the above-described reference value.

The one or more processors 210 may control one or more thin-film deposition devices using the process condition change data 930 and/or the target sensing data 940. For example, the one or more processors 210 may control a substrate heater 120, a shutter 130, a source heater 140, other valves, etc., according to the process condition change data 930 and/or the target sensing data 940. Accordingly, the substrate temperature, the source flow rate, the temperature in the process chamber, other pressures, and the like can be controlled.

Figure 10:
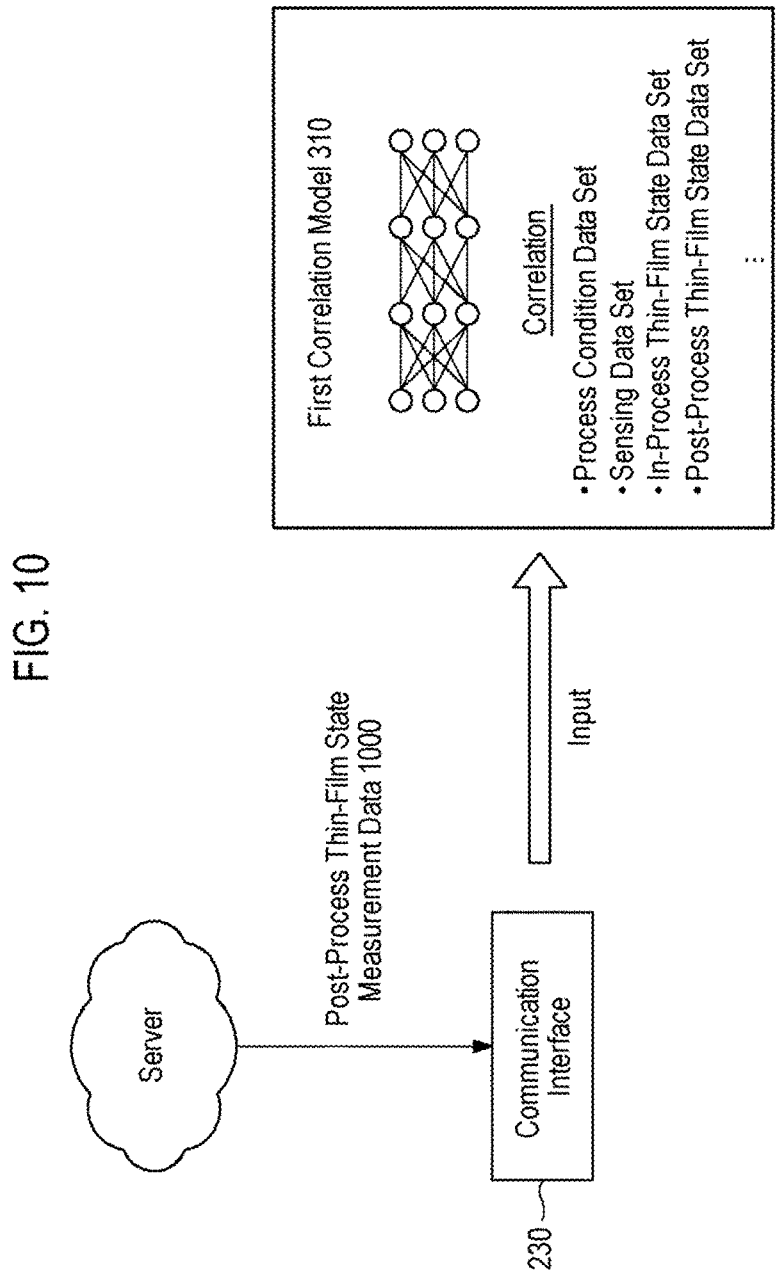
FIG. 10 is a diagram illustrating a process for processing post-process thin-film state measurement data according to an embodiment of the present disclosure.

FIG. 10 is a diagram illustrating a process for processing post-process thin-film state measurement data according to an embodiment of the present disclosure. In an embodiment, the thin-film state of a substrate, after the thin-film deposition process is finished, may be measured outside the process chamber (an ex-situ measurement). Such a measurement may include a non-contact surface resistance or map measurement, a photo luminescence point or map measurement, an Atomic Force Microscope (AFM) particle count map measurement, a reflectometer point or map measurement, a bending degree map measurement, and/or an X-ray diffraction spectroscopic point or map measurement. Depending on embodiments, this measurement process may be referred to as an external measurement service. In an embodiment, the post-process thin-film state measurement data 1000 obtained according to the measurement may be stored in a server.

In an embodiment, the one or more processors 210 may control the communication interface 230 so as to receive necessary information from the server. The information received from the server may be stored in the one or more memories 220. In an embodiment, the information received from the server may include post-process thin-film state measurement data 1000. The one or more processors 210 may receive information such as the post-process thin-film state measurement data 1000 from the server via the communication interface 230 using a predetermined Application Program Interface (API).

In an embodiment, the apparatus 100 may compare the post-process thin-film state measurement data 1000 received from the server with the post-process thin-film state data 340 derived (predicted) by the first correlation model. Through the comparison, the apparatus 100 may cause the first correlation model 310 to learn. Specifically, the one or more processors 210 may input the above-described process condition data 320, in-process thin-film state data 330, post-process thin-film state measurement data 1000, and/or the post-process thin-film state data 340 that is derived from the first correlation model 310, to the first correlation model 310. The first correlation model 310 may derive a correlation between the input data. The first correlation model 310 may update the correlation of the first correlation model 310 using the derived correlation. That is, the first correlation model 310 may perform the machine learning using the input data.

In an embodiment, the thin-film state of the substrate, on which the thin-film deposition process has been completed, is measured by the one or more measurement devices, rather than being measured by an external service and delivered to the apparatus 100 via the server.

Figure 11:
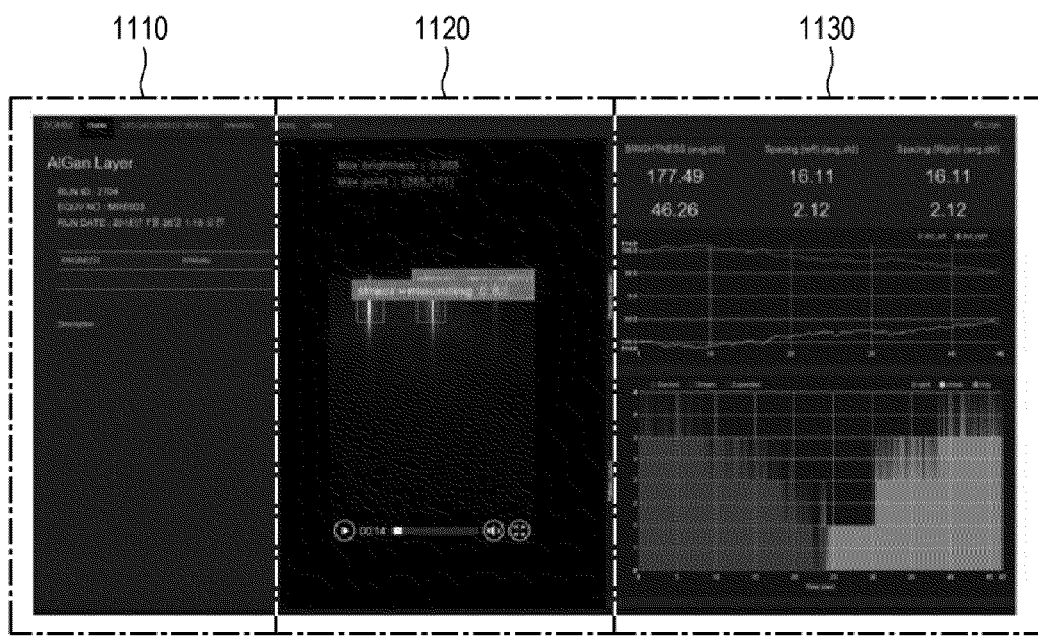
FIG. 11 is a diagram illustrating a display screen of one or more output devices according to an embodiment of the present disclosure.

FIG. 11 is a diagram illustrating a display screen of one or more output devices according to an embodiment of the present disclosure. As described above, the one or more processors 210 may deliver various pieces of information to the one or more output devices. The one or more output devices may display various pieces of delivered information to the user.

Specifically, the one or more processors 210 may deliver, to the one or more output devices, at least one selected from: process condition data 320; in-process thin-film state data 330; post-process thin-film state data 340 derived by the first correlation model 310; thin-film measurement results 410; pre-processed measurement data 460 and 480; thin film specification data 350; the probability 360 that the target thin film is to be determined to be good; a reference value for the calculated probability 360; sensing data 325 of the one or more thin-film deposition devices; process condition change data 930; target sensing data 940; post-process thin-film state measurement data 1000; and/or a thin-film deposition method used in the process. The output devices may display the received data to the user. For example, a diffraction pattern image may be output as the thin-film measurement result 410, and a pattern type, a pattern interval, and the like may be output as pre-processed measurement data 460 and 480.

In an embodiment, the one or more processors 210 may deliver, to the one or more output devices, at least one selected from: a communication situation among the apparatus 100, the one or more thin-film deposition devices and the one or more measurement devices; kinetic simulation of a dynamically rendered thin-film deposition process, simulation of a crystal structure of an in-process thin film; and/or notifications of an abnormal operation state of the one or more thin-film deposition devices. The one or more output devices may display the received data to the user.

In an embodiment, the data output via the one or more output devices may be arranged and output in a predetermined unified data structure (e.g., text or graphics). In an embodiment, the output data may be rendered according to a predetermined format, or may be formatted and output with predetermined layouts. In an embodiment, when a user inputs a data output method through an input device, output data may be displayed based on the output method. For example, the output device may display: information related to process condition data 320, specification data 350, and specification data; information related to the one or more thin-film deposition devices, the state of the one or more thin-film deposition devices, and an external measurement service; and/or information related to a used measurement method or the like (1110). The one or more output devices may also display thin-film measurement results 410 and/or pre-processed measurement data 460 and 480 (1120). The one or more output devices may also display the results derived by the one or more processors 210 and/or correlation models (1130).

In an embodiment, by outputting various data through the one or more output devices, a user may be guided to control the one or more thin-film deposition devices, or to modify process condition data 320, etc. In addition, through the output of the data, the user may be guided to perform maintenance for the one or more thin-film deposition devices.

Figure 12:
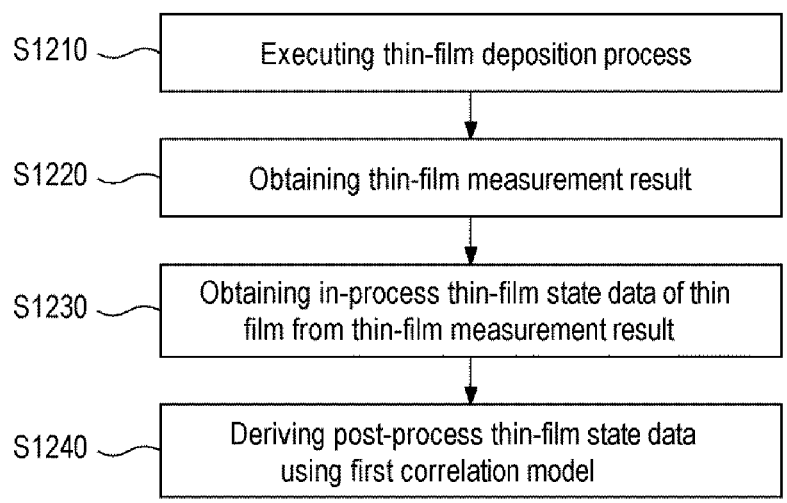
FIG. 12 is a diagram illustrating an embodiment of a thin-film deposition method that may be performed by the apparatus for controlling one or more thin-film deposition devices according to the present disclosure.

FIG. 12 is a diagram illustrating an embodiment of a thin-film deposition method that may be performed by the apparatus for controlling one or more thin-film deposition devices according to the present disclosure. A thin-film deposition method according to the present disclosure may be a computer implemented method. Although respective steps of the method or algorithm according to the present disclosure are illustrated in a sequential order in the illustrated flow chart, the respective steps may be performed in an order in which the steps may optionally be combined by the present disclosure, in addition to being performed sequentially. The description with reference to this flowchart is not intended to preclude a change or modification to the method or algorithm, and does not mean that any step is necessary or desirable. In an embodiment, at least some of the steps may be performed in parallel, repetitively, or heuristically. In an embodiment, at least some of the steps may be omitted, or other steps may be added.

The apparatus 100 according to the present disclosure may perform a thin-film deposition method according to various embodiments of the present disclosure, in performing a thin-film deposition process. The thin-film deposition method according to an embodiment of the present disclosure may include executing a thin-film deposition process (S1210), obtaining a thin-film measurement result (S1220), obtaining in-process thin-film state data from the thin-film measurement result (S1230) and/or deriving post-process thin-film state data of the thin film using the first correlation model (S1240).

In step S1210, the one or more processors 210 may access the one more memory 220 and execute a recipe for performing a thin-film deposition process according to predetermined process condition data 320, thereby controlling the one or more thin-film deposition devices to execute the thin-film deposition process. In step S1220, the one or more processors 210 may obtain thin-film measurement results 410 from the one or more measurement devices that is configured to generate the thin-film measurement results 410 by measuring a state of the thin-film during the thin-film deposition process.

In step S1230, the one or more processors 210 may obtain in-process thin-film state data 330 of the thin film from the thin-film measurement results 410. In step S1240, the one or more processors 210 may derive post-process thin-film state data 340 of the thin film from the process condition data 320, the sensing data 325, and the in-process thin-film state data 330 using the first correlation model 310.

As described above, the sensing data 325 may be generated by sensing the state of at least one of the thin-film deposition devices by the one or more sensors. The first correlation model 310 may be a correlation model established by modeling a correlation of a process condition data set, a sensing data set, an in-process thin-film state data set, and/or a post-process thin-film state data set according to a machine learning algorithm. The process condition data set, the sensing data set, the in-process thin-film state data set, and the post-process thin-film state data set may be generated for a plurality of substrates other than the in-process substrate 105.

In an embodiment, the thin-film deposition method may further include calculating (deriving), by the one or more processors 210, the probability 360 that the target thin film is to be determined to be good based on the post-process thin-film state data 340 and the thin film specification data 350 stored in the one or more memories 220.

In an embodiment, the thin-film deposition method may further include delivering, by the one or more processors 210, a notification indicating the probability 360 to the one or more output devices when the probability 360 is equal to or less than the predetermined reference value.

In an embodiment, step S1230 may further include converting, by the one or more processors 210, a portion of the thin-film measurement results 410 into quantitative data according to a data conversion algorithm so as to obtain pre-processed measurement data 460 and 480.

In an embodiment, step S1230 may further include deriving, by the one or more processors 210, in-process thin-film state data 330 and 480 from at least one selected from the thin-film measurement results 410 and the pre-processed measurement data 460 and 480 using the second correlation model 510.

In an embodiment, the thin-film measurement results 410 may be a diffraction pattern image for a diffraction pattern that is formed when an electron beam, radiated to the in-process thin film by the one or more measurement devices, is reflected. In an embodiment, the pre-processed measurement data 460 and 480 may be at least one selected from the pattern type of the diffraction pattern, the pattern interval of the diffraction pattern, and the intensity of the intensity of the reflected electron beam. In an embodiment, the in-process thin-film state data 330 derived using the second correlation model 510 may include at least one selected from the surface structure of the in-process thin film, the crystal structure of the in-process thin film, the stress of the thin film, the atomic composition of the in-process thin film and the deposition rate of the in-process thin film during the thin-film deposition process.

In an embodiment, the thin-film deposition method may further include delivering, by the one or more processors 210, at least one selected from the process condition data 320, the sensing data 325, the in-process thin-film state data 330, the post-process thin film data 340, the thin-film measurement results 410, and the pre-processed measurement data 460 and 480, to the one or more output devices.

In one embodiment, the thin-film deposition method may further include: deriving, by the one or more processors 210, at least one selected from process condition change data 930 and target sensing data 940, which causes the post-process thin-film state data 340 to be match with the specification data 350, from the process condition data 320, the sensing data 325, and the in-process thin-film state data 330 using the first correlation model 310; and/or controlling the thin-film deposition devices, based on at least one selected from the process condition change data 930 and the target sensing data 940.

In an embodiment, the thin-film deposition method may further include: deriving, by the one or more processors 210, at least one selected from process condition change data 930 and target sensing data 940, which makes the probability 360 equal to or larger than the reference value, from the process condition data 320, the sensing data 325, and the in-process thin-film state data 330 using the first correlation model 310; and/or controlling the thin-film deposition devices, based on at least one selected from the process condition change data 930 and the target sensing data 940.

In an embodiment, the thin-film deposition method may further include receiving from the server, by the one or more processors 210, post-process thin-film state measurement data 1000 via a communication interface 230 using a predetermined API. The post-process thin-film state measurement data 1000 may be thin-film state data obtained by measuring the thin film after the thin-film deposition process is performed.

In an embodiment, the one or more processors 210 may further include updating, by the one or more processors 210, the correlation of the first correlation model 310 according to a mechanical learning algorithm by inputting the process condition data 320, the sensing data 325, the in-process thin-film state data 330, the post-process thin-film state measurement data 1000, and/or the post-process thin-film state data 340 that is derived from the first correlation model 310, to the first correlation model 310.

In an embodiment, the one or more thin-film deposition devices may perform a thin-film deposition process according to at least one thin-film deposition method selected from Molecular Beam Epitaxy (MBE), Pulsed Laser Deposition (PLD), Metal Organic Chemical Vapor Deposition (MOCVD), Plasma Enhanced Chemical Vapor Deposition (PECVD), Atomic Layer Deposition (ALD), evaporation, sputtering, and sublimation.

Various embodiments of the present disclosure may be implemented as software recorded in a machine-readable recording medium. The software may be software for implementing various embodiments of the present disclosure described above. The software may be inferred from various embodiments of the present disclosure by programmers of the technical field to which the present disclosure belongs. For example, the software may be commands (e.g., codes or code segments) or a machine-readable program. The machine is an apparatus operable according to a command called from a recording medium, and may be, for example, a computer. In an embodiment, the machine may be the apparatus 100 according to embodiments of the present disclosure. In an embodiment, a processor of the machine may execute the called commands so as to cause the components of the machine to perform functions corresponding to the commands. In an embodiment, the processor may be the one or more processors 210 according to embodiments of the present disclosure. The term "recording medium" may mean all kinds of recording mediums, which are stored with machine-readable data. The recording medium may include, for example, ROM, RAM, CD-ROM, magnetic tape, floppy disk, optical data storage, and the like. In an embodiment, the recording medium may be the one or more memories 220. In an embodiment, the recording medium may be implemented in the form of being distributed in networked computer systems or the like. The software may be distributed and stored in computer systems or the like so as to be executed. The recording medium may be a non-transitory recording medium. The term "non-transitory recording medium" means a tangible medium regardless of whether data is stored therein semi-permanently or temporarily, and does not include a signal propagated in a transitory manner.

Although the technical idea of the present disclosure has been described above by way of various embodiments, the technical scope of the present disclosure covers various substitutions, modifications, and changes that can be made by a person ordinarily skilled in the technical field to which the present disclosure belongs. It should also be understood that such substitutions, modifications and changes are intended to fall within the scope of the present disclosure that is defined in the accompanying claims.

What is claimed is:

1. An apparatus for controlling a substrate heater, a shutter, and a source heater to perform a target thin-film deposition process for depositing a target thin film on a target substrate, wherein the substrate heater adjusts a temperature of the target substrate, the shutter opens or closes a hole through which a source for the target thin film is emitted into a process chamber, and the source heater heats the source, the apparatus comprising:
an electron gun configured to irradiate an electron beam to the target thin film being deposited on the target substrate during the target thin-film deposition process;
an electron diffraction measurement device configured to generate a first thin-film measurement result that is a diffraction pattern image of a diffraction pattern by measuring the diffraction pattern formed as the electron beam is reflected from the target thin film being deposited;
a combination of a substrate temperature sensor, a flow rate sensor, and a source temperature sensor, configured to generate first sensing data during the target thin-film deposition process, wherein the first sensing data includes the temperature of the target substrate measured by the substrate temperature sensor, an amount of the source emitted by an operation of the shutter measured by the flow rate sensor, and a temperature of the source measured by the source temperature sensor;
a communication interface configured to communicate with the substrate heater, the shutter, and the source heater;
one or more memories configured to store a first correlation model and a recipe for performing the target thin-film deposition process according to predetermined first process condition data that indicates process conditions for the substrate heater, the shutter, and the source heater, wherein the first correlation model is learned according to a first machine learning algorithm using multiple first data sets, the multiple first data sets are collected from multiple thin-film deposition processes for other substrates, and each of the multiple first data sets includes second process condition data, second sensing data, second in-process thin-film state data and second post-process thin-film state data of a thin-film deposition process for a substrate, such that the first correlation model learns a mapping between (1) the second process condition data, the second sensing data, and the second in-process thin-film state data, and (2) the second post-process thin-film state data; and
one or more processors configured to:
control the substrate heater, the shutter, and the source heater to perform the target thin-film deposition process by executing the recipe;
pre-process the first thin-film measurement result to output first pre-processed measurement data including a pattern type of the diffraction pattern, a pattern interval of the diffraction pattern, and an intensity of the electron beam reflected from the target thin film being deposited;
obtain first in-process thin-film state data, which indicates a state of the target thin film during the target thin-film deposition process, based on both the first thin-film measurement result and the first pre-processed measurement data;
derive first post-process thin-film state data, which indicates a predicted state of the target thin film after the target thin-film deposition process, from the first process condition data, the first sensing data, and the first in-process thin-film state data using the first correlation model;
derive new process condition data for the target thin-film deposition process that is configured to make the first post-process thin-film state data of the target thin film have a desired value, from the first process condition data, the first sensing data, and the first in-process thin-film state data using the first correlation model; and
control the substrate heater, the shutter, and the source heater based on the new process condition data to deposit the target thin film on the target substrate,
wherein the state of the target thin film during or after the target thin-film deposition process includes a surface structure, a crystal structure, an atomic composition, stress, and a deposition rate of the target thin film during or after the target thin-film deposition process, respectively.

2. The apparatus of claim 1, wherein the one or more memories are further configured to store specification data of the target thin film, and
wherein the one or more processors are further configured to calculate a probability that the target thin film is to be determined to be good after the target thin-film deposition process, based on the first post-process thin-film state data and the specification data.

3. The apparatus of claim 2, wherein the one or more processors are further configured to deliver a notification indicating the probability to one or more output devices when the probability is equal to or less than a predetermined reference value.

4. The apparatus of claim 1, wherein the one or more processors are further configured to pre-process the first thin-film measurement result to output the first pre-processed measurement data by converting a portion of the first thin-film measurement result into quantitative data.

5. The apparatus of claim 4, wherein the one or more memories are further configured to store a second correlation model,
wherein the second correlation model is learned according to a second machine learning algorithm using multiple second data sets, the multiple second data sets are collected from the multiple thin-film deposition processes for other substrates, and each of the multiple second data sets includes second thin-film measurement results, second pre-processed measurement data and the second in-process thin-film state data of a thin-film deposition process for a substrate, such that the second correlation model learns a mapping between (1) the second thin-film measurement results and the second pre-processed measurement data, and (2) the second in-process thin-film state data, and
wherein the one or more processors are further configured to derive the first in-process thin-film state data based on both the first thin-film measurement result and the first pre-processed measurement data using the second correlation model.

6. The apparatus of claim 5, wherein the one or more processors are further configured to deliver at least one selected from the first process condition data, the first sensing data, the first in-process thin-film state data, the first post-process thin-film state data, the first thin-film measurement result, and the first pre-processed measurement data to one or more output devices.

7. The apparatus of claim 3, wherein the one or more processors are further configured to:
derive the new process condition data for the target thin-film deposition process that is configured to make the probability equal to or larger than the reference value, from the first process condition data, the first sensing data and the first in-process thin-film state data using the first correlation model; and
control the substrate heater, the shutter, and the source heater based on the new process condition data that is configured to make the probability equal to or larger than the reference value.

8. The apparatus of claim 1, wherein the one or more processors are further configured to receive post-process thin-film state measurement data from a server, which stores the post-process thin-film state measurement data that is measured on the target thin film after the target thin-film deposition process is performed, via the communication interface using a predetermined Application Program Interface (API).

9. The apparatus of claim 8, wherein the one or more processors are further configured to update the mapping of the first correlation model according to the first machine learning algorithm by inputting the first process condition data, the first sensing data, the first in-process thin-film state data, the post-process thin-film state measurement data, and the first post-process thin-film state data derived from the first correlation model, to the first correlation model.

10. The apparatus of claim 1, wherein the target thin-film deposition process is performed according to at least one thin-film deposition method selected from Molecular Beam Epitaxy (MBE), Pulsed Laser Deposition (PLD), Metal Organic Chemical Vapor Deposition (MOCVD), Plasma Enhanced Chemical Vapor Deposition (PECVD), Atomic Layer Deposition (ALD), evaporation, sputtering, and sublimation.

11. A method for controlling a substrate heater, a shutter, and a source heater to perform a target thin-film deposition process for depositing a target thin film on a target substrate, wherein the substrate heater adjusts a temperature of the target substrate, the shutter opens or closes a hole through which a source for the target thin film is emitted into a process chamber, and the source heater heats the source,
the method being performed by the apparatus of claim 1, wherein the method comprises:
controlling, by the one or more processors of the apparatus, the substrate heater, the shutter, and the source heater to perform the target thin-film deposition process by executing the recipe;
pre-processing, by the one or more processors of the apparatus, the first thin-film measurement result to output first pre-processed measurement data including a pattern type of the diffraction pattern, a pattern interval of the diffraction pattern, and an intensity of the electron beam reflected from the target thin film being deposited;
obtaining, by the one or more processors of the apparatus, first in-process thin-film state data, which indicates a state of the target thin film during the target thin-film deposition process, based on both the first thin-film measurement result and the first pre-processed measurement data;
deriving, by the one or more processors of the apparatus, first post-process thin-film state data, which indicates a predicted state of the target thin film after the target thin-film deposition process, from the first process condition data, the first sensing data, and the first in-process thin- film state data using the first correlation model;
deriving, by the one or more processors of the apparatus, new process condition data for the target thin-film deposition process that is configured to make the first post-process thin-film state data of the target thin film have a desired value, from the first process condition data, the first sensing data, and the first in-process thin-film state data using the first correlation model; and
controlling, by the one or more processors of the apparatus, the substrate heater, the shutter, and the source heater based on the new process condition data to deposit the target thin film on the target substrate,
wherein the first correlation model is learned according to a first machine learning algorithm using multiple first data sets, the multiple first data sets are collected from multiple thin-film deposition processes for other substrates, and each of the multiple first data sets includes second process condition data, second sensing data, second in-process thin-film state data and second post-process thin-film state data of a thin-film deposition process for a substrate, such that the first correlation model learns a mapping between (1) the second process condition data, the second sensing data, and the second in-process thin-film state data, and (2) the second post-process thin-film state data, and wherein the state of the target thin film during or after the target thin-film deposition process includes a surface structure, a crystal structure, an atomic composition, stress, and a deposition rate of the target thin film during or after the target thin-film deposition process, respectively.

12. The method of claim 11, wherein the method further comprises:

calculating, by the one or more processors of the apparatus, a probability that the target thin film is to be determined to be good after the target thin-film deposition process, based on the first post-process thin-film state data and specification data of the target thin film.

13. A non-transitory computer-readable storage medium storing commands that, when executed by the one or more processors of the apparatus of claim 1, cause the one or more processors to perform:

controlling a substrate heater, a shutter, and a source heater to perform a target thin-film deposition process for depositing a target thin film on a target substrate by executing a recipe, wherein the substrate heater adjusts a temperature of the target substrate, the shutter opens or closes a hole through which a source for the target thin film is emitted into a process chamber, and the source heater heats the source, wherein the recipe is for performing the target thin-film deposition process according to predetermined first process condition data that indicates process conditions for the substrate heater, the shutter, and the source heater;

receiving, via the communication interface of the apparatus, a first thin-film measurement result from the electron diffraction measurement device of the apparatus, wherein the electron diffraction measurement device is configured to generate the first thin-film measurement result that is a diffraction pattern image of a diffraction pattern by measuring the diffraction pattern formed as an electron beam irradiated from the electron gun of the apparatus during the target thin-film deposition process is reflected from the target thin film being deposited on the target substrate;

pre-processing the first thin-film measurement result to output first pre-processed measurement data including a pattern type of the diffraction pattern, a pattern interval of the diffraction pattern, and an intensity of the electron beam reflected from the target thin film being deposited;

obtaining first in-process thin-film state data, which indicates a state of the target thin film during the target thin-film deposition process, based on both the first thin-film measurement result and the first pre-processed measurement data;

deriving first post-process thin-film state data, which indicates a predicted state of the target thin film after the target thin-film deposition process, from the first process condition data, first sensing data, and the first in-process thin-film state data using a first correlation model, wherein the first sensing data is generated during the target thin-film deposition process by the combination of the substrate temperature sensor, the flow rate sensor, and the source temperature sensor of the apparatus, wherein the first sensing data includes the temperature of the target substrate measured by the substrate temperature sensor, an amount of the source emitted by an operation of the shutter measured by the flow rate sensor, and a temperature of the source measured by the source temperature sensor;

deriving new process condition data for the target thin-film deposition process that is configured to make the first post-process thin-film state data of the target thin film have a desired value, from the first process condition data, the first sensing data, and the first in-process thin- film state data using the first correlation model; and controlling the substrate heater, the shutter, and the source heater based on the new process condition data to deposit the target thin film on the target substrate, wherein the first correlation model is learned according to a first machine learning algorithm using multiple first data sets, the multiple first data sets are collected from multiple thin-film deposition processes for other substrates, and each of the multiple first data sets includes second process condition data, second sensing data, second in-process thin-film state data and second post-process thin-film state data of a thin-film deposition process for a substrate, such that the first correlation model learns a mapping between (1) the second process condition data, the second sensing data, and the second in-process thin-film state data, and (2) the second post-process thin-film state data, and wherein the state of the target thin film during or after the target thin-film deposition process includes a surface structure, a crystal structure, an atomic composition, stress, and a deposition rate of the target thin film during or after the target thin-film deposition process, respectively.

14. The non-transitory computer-readable storage medium of claim 13, wherein the commands further cause the one or more processors of the apparatus to perform:

calculating a probability that the target thin film is to be determined to be good after the target thin-film deposition process, based on the first post-process thin-film state data and specification data of the target thin film; and delivering a notification indicating the probability to one or more output devices when the probability is equal to or less than a predetermined reference value.

15. The non-transitory computer-readable storage medium of claim 13, wherein the pre-processing the first thin-film measurement result includes:

pre-processing the first thin-film measurement result to output the first pre-processed measurement data by converting a portion of the first thin-film measurement result into quantitative data.

16. The non-transitory computer-readable storage medium of claim 15, wherein the obtaining the first in-process thin-film state data further includes:

deriving the first in-process thin-film state data based on both the first thin-film measurement result and the first pre-processed measurement data using a second correlation model, wherein the second correlation model is learned according to a second machine learning algorithm using multiple second data sets, the multiple second data sets are collected from the multiple thin-film deposition processes for other substrates, and each of the multiple second data sets includes second thin-film measurement results, second pre-processed measurement data and the second in-process thin-film state data of a thin-film deposition process for a substrate, such that the second correlation model learns a mapping between (1) the second thin-film measurement results and the second pre-processed measurement data, and (2) the second in-process thin-film state data.

17. The non-transitory computer-readable storage medium of claim 16, wherein the commands further cause the one or more processors of the apparatus to perform:
   delivering at least one selected from the first process condition data, the first sensing data, the first in-process thin-film state data, the first post-process thin-film state data, the first thin- film measurement result, and the first pre-processed measurement data to one or more output devices.

18. The non-transitory computer-readable storage medium of claim 14, wherein the commands further cause the one or more processors of the apparatus to perform:
   deriving the new process condition data for the target thin-film deposition process that is configured to make the probability equal to or larger than the reference value, from the first process condition data, the first sensing data and the first in-process thin-film state data using the first correlation model; and
   controlling the substrate heater, the shutter, and the source heater based on the new process condition data that is configured to make the probability equal to or larger than the reference value.

* * * * *